US007709750B2

(12) United States Patent
Hashimoto et al.

(10) Patent No.: US 7,709,750 B2
(45) Date of Patent: May 4, 2010

(54) SHIELDING FILM, SHIELDED PRINTED CIRCUIT BOARD, SHIELDED FLEXIBLE PRINTED CIRCUIT BOARD, METHOD OF MANUFACTURING SHIELDING FILM, AND METHOD OF MANUFACTURING SHIELDED PRINTED CIRCUIT BOARD

(75) Inventors: Kazuhiro Hashimoto, Higashiosaka (JP); Syohei Morimoto, Higashiosaka (JP); Yoshinori Kawakami, Higashiosaka (JP); Kenji Kamino, Higashiosaka (JP); Satoshi Ebihara, Tsukuba (JP); Hideaki Tanaka, Tsukuba (JP); Takahisa Akatsuka, Tsukuba (JP)

(73) Assignees: Tatsuta System Electronics Co, Ltd., Higashiosaka-shi (JP); Nippon Mektron, Ltd., Tokyo (JP)

( * ) Notice: Subject to any disclaimer, the term of this patent is extended or adjusted under 35 U.S.C. 154(b) by 160 days.

(21) Appl. No.: 11/914,291

(22) PCT Filed: May 10, 2006

(86) PCT No.: PCT/JP2006/309870

§ 371 (c)(1),
(2), (4) Date: Nov. 13, 2007

(87) PCT Pub. No.: WO2006/121194

PCT Pub. Date: Nov. 16, 2006

(65) Prior Publication Data

US 2009/0038839 A1 Feb. 12, 2009

(30) Foreign Application Priority Data

May 13, 2005 (JP) ............................. 2005-141872

(51) Int. Cl.
*H05K 9/00* (2006.01)

(52) U.S. Cl. ...................... 174/378; 174/255; 174/386; 361/816

(58) Field of Classification Search ................. 174/377, 174/384, 386, 255, 257, 378; 361/816, 818, 361/800
See application file for complete search history.

(56) References Cited

U.S. PATENT DOCUMENTS 5,639,989 A * 6/1997 Higgins, III ................. 174/386

(Continued)

FOREIGN PATENT DOCUMENTS

JP  63 293999  11/1988

(Continued)

OTHER PUBLICATIONS

Machine translation for JP 2003-086907, Jun. 15, 2009, pp. 1-12.*

(Continued)

*Primary Examiner*—Hung V Ngo
(74) *Attorney, Agent, or Firm*—Oblon, Spivak, McClelland, Maier & Neustadt, L.L.P.

(57) ABSTRACT

The invention includes a shielding film, which does not have breakage of a metal layer, and has excellent abrasion resistance and blocking resistance, and does not crack. The cover film 7 is provided on one surface of a separation film 6a, and an adhesive layer 8a is formed on the surface of the cover film 7 opposite to the separation film 6a via the metal layer. The cover film 7 has at least one hard layer 7a and at least one soft layer 7b, and the surface of the cover film 7 facing the separation film 6a is composed of the hard layer 7a.

16 Claims, 10 Drawing Sheets

U.S. PATENT DOCUMENTS

| | | | |
|---|---|---|---|
| 5,729,897 A * | 3/1998 | Schmidt et al. | 29/852 |
| 6,707,682 B2 * | 3/2004 | Akiba et al. | 361/763 |
| 7,446,265 B2 * | 11/2008 | Krohto et al. | 174/377 |
| 2002/0015293 A1 * | 2/2002 | Akiba et al. | 361/793 |
| 2002/0129971 A1 * | 9/2002 | Kolb et al. | 174/256 |

FOREIGN PATENT DOCUMENTS

| | | |
|---|---|---|
| JP | 4-15256 | 2/1992 |
| JP | 4-15257 | 2/1992 |
| JP | 8-153940 | 6/1996 |
| JP | 2000-71392 A | 3/2000 |
| JP | 2000-269632 | 9/2000 |
| JP | 2003-86907 | 3/2003 |
| JP | 2003-298285 | 10/2003 |
| JP | 2004 095566 | 3/2004 |
| JP | 2005-19965 A | 1/2005 |
| JP | 2005-56906 | 3/2005 |

OTHER PUBLICATIONS

Abstract for JP 2000-71392 published Mar. 7, 2000.*
Abstract for JP 2005-19965 published Jan. 20, 2005.*

* cited by examiner (a)

(b)

(c)

(a)

(b)

(a)

(b)

(c)

(a)

(b)

(c)

F: FORCE CONVERTER

C1, C2: CLAMP

S: SPECIMEN

D: DISPLACEMENT CONVERTER

V: OSCILLATOR (a)

(b)

SHIELDING FILM, SHIELDED PRINTED CIRCUIT BOARD, SHIELDED FLEXIBLE PRINTED CIRCUIT BOARD, METHOD OF MANUFACTURING SHIELDING FILM, AND METHOD OF MANUFACTURING SHIELDED PRINTED CIRCUIT BOARD

TECHNICAL FIELD

The present invention relates to a shielding film shielding a printed circuit board etc. which is used in a device such as a computer, a communication device, a printer, a mobile phone, a video camera, or the like, a method of manufacturing the shielding film, a shielded printed circuit board and a shielded flexible printed circuit board that are manufactured by using the shielding film, and a method of manufacturing a shielded printed circuit board.

BACKGROUND ART

A flexible printed circuit board (hereinafter, referred to as 'FPC') has a printed circuit, which is provided on at least one surface of a flexible insulating film such as a polyimide film or a polyester film with or without an adhesive between the printed circuit and the flexible film. According to need, a flexible insulating film having openings is adhered on the surface of the printed circuit by an adhesive, or a protective layer is formed on the surface of the printed circuit. The openings are formed on the flexible insulating film so as to correspond to portions on which terminals used to mount circuit components or terminals used to be connected with an external board are formed. The protective layer is formed on the surface of the printed circuit by methods of coating, drying, exposing, developing, and heat-treating a photosensitive insulating resin. The FPC is widely used to build a circuit into a complex mechanism of an electronic device such as a mobile phone, video camera, personal lap top computer or the like which have been rapidly miniaturized and multi-functionalized. In addition, the FPC is also used to connect a moving unit such as a printer head with a control unit due to its excellent flexibility. A shielding countermeasure against electromagnetic wave has been required for the electronic device in which the FPC is widely used. Accordingly, a shielded flexible printed circuit board (hereinafter, referred to as a 'shielded FPC') having the shielding countermeasure against electromagnetic wave has been used as the FPC to be built in the device.

In addition, similar to a flex rigid board or a flexboard (registered trade mark), the following FPC has been used recently. In the FPC, the printed circuit board is partially laminated to form multilayered portions used to mount components, and cable portions extend outside from the multilayered portions. Specifically, Similar to the electronic device, shielding countermeasures against electromagnetic wave have been required for the cable portions of the boards.

The shielded FPC uses a flexible insulating film as a cover film. Furthermore, a shielding layer is provided on one surface of the cover film, and a releasable adhesive film having adhesion is adhered on the other surface of the cover film in order to form a reinforcement-shielding film. Then, the shielding film is adhered on at least one surface of the FPC by using a conductive adhesive and by heating and pressing the shielding film and the FPC. Further, after the shielding layer is electrically connected to the grounding circuit formed on the FPC by the conductive adhesive, the adhesive film is released. Here, when an electric connection between the shielding layer and the grounding circuit is not particularly required, a normal adhesive not having conductivity may be used instead of the conductive adhesive to adhere the shielding layer to the grounding circuit. The FPC is directly connected to a rigid circuit board, or the multilayered portions used to mount components are formed to be connected to the cable portions like the flex rigid board or the flexboard. In this case, according to need, a shielding layer is also provided on a rigid circuit board or the multilayered portions used to mount components similar to the above-mentioned structure. Therefore, it is possible to adequately manage electromagnetic wave.

However, there are many cases where the cover film used in the shielding film is made of engineering plastic such as polyphenylenesulfide (PPS), polyester, aromatic aramid, and the thickness of the cover film is thick (for example, 9 μm) or the stiffness thereof is strong. For this reason, the flexibility of the cover film deteriorates. Moreover, when the adhesive film is released from the shielded FPC and then a glass epoxy board or the like is adhered on the cover film to reinforce the shielded FPC, PPS barely adheres to the glass epoxy board or the like due to the fact that PPS has difficulty in adhesion.

In order to solve the above-mentioned problem, the following shielding film and a method of manufacturing the shielding film has been disclosed in JP-A-2004-95566. In the shielding film, a resin having excellent thermal resistance and adhesiveness is coated on one surface of a separation film via a release agent layer to form the shielding film, and an adhesive layer is further provided on the cover film via a metal layer. Here, since the cover film has excellent flexibility and is formed by the coating method, the thickness of the cover film is thin, that is, about 5 μm. In addition, since the cover film has adhesion, it is possible to easily adhere a glass epoxy board after the release of the separation film.

DISCLOSURE OF THE INVENTION

However, the following problems are generated. That is, (1) the cover film, which is formed by coating the resin having excellent thermal resistance such as a polyimide resin, an epoxy resin, or the like, is soft. For example, a shielded FPC used for a moving unit such as a mobile phone, a printer, or the like, is worn by rubbing against another part such as a housing or the like, and does not serve as a protective layer after the release of the separation film. (2) In addition, when the shielded FPC is heated and pressed, the cover film serving as a base is softened. For this reason, dents occur on the upper side of the insulation removed portions for connecting the grounding circuit. As a result, breakage such as a cracking, fracture, or the like occurs in the metal layer. (3) Furthermore, the cover film has excellent adhesion. For this reason, when the cover film comes in contact with a conveyor jig, conveyor belt, or the like on which the circuit board is loaded to be conveyed, in a process requiring heat, such as a reflow process in the process of mounting circuit components, the cover film is attached thereto. As a result, the blocking resistance deteriorates.

Consequently, a method in which a cover film having high hardness is made of a resin having excellent abrasion resistance has been considered. However, the cover film having high hardness is brittle. For this reason, when the shielding film using the cover film is adhered on a foundation film including printed circuits, the cover film having high hardness cracks due to the concavity and convexity of the insulation removed portions of the insulating film.

It is an object of the invention to provide a shielding film, a shielded printed circuit board, a shielded flexible printed circuit board in which each have a cover film not having breakage of a metal layer, and having excellent abrasion resistance and blocking resistance, and no cracking is generated. In addition, it is an object of the invention to provide a method of manufacturing the shielding film and a method of manufacturing the shielded printed circuit board.

A shielding film according to an aspect of the invention includes: a separation film; a cover film provided on one surface of the separation film; and an adhesive layer, which is formed on the surface of the cover film opposite to the separation film via a metal layer. In this case, the cover film includes at least one hard layer and at least one soft layer, and the surface of the cover film facing the separation film is composed of the hard layer.

According to the shielding film of the invention, the surface face is composed of the hard layer, and the hard layer having excellent abrasion resistance serves as a protective layer after the release of the separation film. Accordingly, it is possible to prevent the abrasion of the cover film. Furthermore, since the hard layer has excellent blocking resistance, the hard layer is not attached to another part in a process required to be heated. The metal layer, which is provided on the hard layer with the soft layer interposed between the metal layer and the hard layer, is protected by excellent hardness of the hard layer. For this reason, even though the metal layer provided on the hard layer via a soft layer is heated and pressed, breakage such as a cracking, fracture, or the like does not occur. Further, when the shielding film is adhered on the foundation including the printed circuit, it is possible to prevent the hard layer from cracking because of the cushioning effect of the soft layer.

Further, in the shielding film of the invention, at least one layer of the hard layer and the soft layer may be composed of a coating layer. As a result, it is possible to make the shielding film thin, and to provide a shielding film having excellent flexibility.

A shielded printed circuit board according to another aspect of the invention includes: a metal layer, which is provided on at least one surface of a foundation including at least one printed circuit via a adhesive layer; and a cover film, which is provided on the surface of the metal layer opposite to the adhesive layer. In this case, the cover film includes at least one hard layer and at least one soft layer, and the outermost surface of the cover film is composed of a hard layer.

According to the shielded printed circuit board of the invention, since the outermost surface of the cover film is composed of the hard layer having excellent abrasion resistance and blocking resistance, it is possible to prevent abrasion of the cover film. In addition, since the hard layer has excellent blocking resistance, the hard layer is not attached to a conveyor jig, conveyor belt, or the like on which the circuit board is loaded to be conveyed, in a process requiring heat, such as a reflow process in the process of mounting circuit components.

In the above-mentioned shielded flexible printed circuit board, it is preferable that the foundation including the printed circuit be composed of a flexible printed circuit board in the above-mentioned shielded printed circuit board.

According to the shielded flexible printed circuit board of the invention, the shielded flexible printed circuit board can have excellent sliding resistance, which is a characteristic required for the flexible printed circuit board.

In the shielded flexible printed circuit board of the invention, it is preferable that the foundation including the printed circuit be composed of a TAB tape for a tape carrier package. As a result, since the shielding film has excellent flexibility, the rebound resilience of the shielding film deteriorates, such that it is possible to improve the efficiency in assembling.

In the shielding film of the invention, the adhesive layer, which is formed on the surface of the cover film opposite to the separation film via a metal layer, may be composed of a conductive adhesive. As a result, the metal layer and the grounding circuit of the printed circuit board can be electrically connected to each other.

Moreover, in the shielding film of the invention, the above-mentioned conductive adhesive may be an anisotropic conductive adhesive. As a result, it is possible to make the conductive adhesive thinner than the above-mentioned conductive adhesive, and to reduce the amount of conductive filler. Accordingly, it is possible to form a shielding film having excellent flexibility.

In a method of manufacturing a shielding film of the invention, the cover film is formed by stratifying a hard layer and a soft layer on one surface of the separation film. The shielding film includes: a separation film; a cover film provided on one surface of the separation film; and an adhesive layer that is formed on the surface of the cover film opposite to the separation film via the metal layer.

According to the method of manufacturing a shielding film of the invention, since the hard layer and the soft layer are stratified, it is possible to manufacture the shielding film, which has excellent abrasion resistance and blocking resistance. Furthermore, even though the shielding film is heated and pressed, breakage such as a cracking, fracture, or the like does not occur in the shielding film.

Further, in the method of manufacturing a shielding film of the invention, at least one layer of the hard layer and the soft layer may be composed of a coating layer. As a result, it is possible to make the cover film thin, and to manufacture shielding film having excellent flexibility.

Furthermore, in the method of manufacturing a shielding film of the invention, the hard layer and the soft layer may be sequentially coated on one surface of the separation film. According to this structure, since the separation film can be used as a carrier film during the coating, it is possible to easily make the hard layer and the soft layer thin. In addition, it is possible to provide the shielding film, which has a thinner cover film, having excellent flexibility, and to reliably provide the shielding film at low cost.

It is preferable that a method of manufacturing the shielded printed circuit board of the invention, include: placing the above-mentioned shielding film on at least one surface of a foundation including at least one printed circuit; heating and pressing the shielding film; and releasing the separation film.

According to the method of manufacturing the shielded printed circuit board of the invention, it is possible to easily manufacture the shielded printed circuit board having a cover film, which does not have breakage of a metal layer, having excellent abrasion resistance and blocking resistance, and not cracking.

Furthermore, a method of manufacturing a shielded printed circuit board according to another aspect of the invention includes: removing a portion of an insulating material covering a grounding circuit from a printed circuit, which includes a signal circuit and a grounding circuit formed on a base film, in order to prepare a foundation having the exposed grounding circuit; placing the above-mentioned shielding film in which the above-mentioned adhesive layer is a conductive adhesive layer or an anisotropic conductive adhesive layer on the foundation; and heating and pressing the shielding film so that the shielding film are adhered to each other and the grounding circuit is electrically connected to the metal layer.

According to the above-mentioned method of manufacturing a shielded printed circuit board, since the cover film is composed of the hard layer and the soft layer, the conductive adhesive or the anisotropic conductive adhesive softened due to heating is easily embedded into the insulation removed portions. Further, it is possible to ground the metal layer or the shielding layer, which is composed of the metal layer and the adhesive layer, via a grounding circuit. In addition, when the adhesive layer is non-conductive, the metal layer may be connected to a case or the like by another method.

Moreover, in the above-mentioned method of manufacturing a shielded printed circuit board of the invention, the foundation including at least one printed circuit may be composed of a flexible printed circuit board. As a result, it is possible to obtain a flexible printed circuit board having excellent flexibility and sliding resistance.

Furthermore, in the above-mentioned method of manufacturing a shielded printed circuit board, the foundation including at least one printed circuit may be composed of a TAB tape for a tape carrier package. As a result, it is possible to obtain a flexible TAB tape for a tape carrier package, which has excellent efficiency in assembling.

BRIEF DESCRIPTION OF THE DRAWINGS

FIG. 1(a) shows a state in which a shielding film is placed on a foundation film and is then pressed by a press while heated, FIG. 1(b) shows a state in which a separation film is released, and FIG. 1(c) shows a state in which the separation film has been released.

FIG. 2(a) shows a shielding layer composed of an adhesive layer and a metal layer, and FIG. 2(b) shows a shielding layer composed of only an adhesive layer.

FIG. 3(a) is similar to FIG. 1(c), and each of FIGS. 3(b) and 3(c) is a cross-sectional view showing a shielded FPC that is shielded on the both surfaces thereof.

FIG. 4(a) is a top view of the shielded FPC, FIG. 4(b) is a cross-sectional view thereof in a width direction of the shielded FPC, and FIG. 4(c) is a cross-sectional view thereof in a longitudinal direction.

BEST MODE FOR CARRYING OUT THE INVENTION

Figure 1:
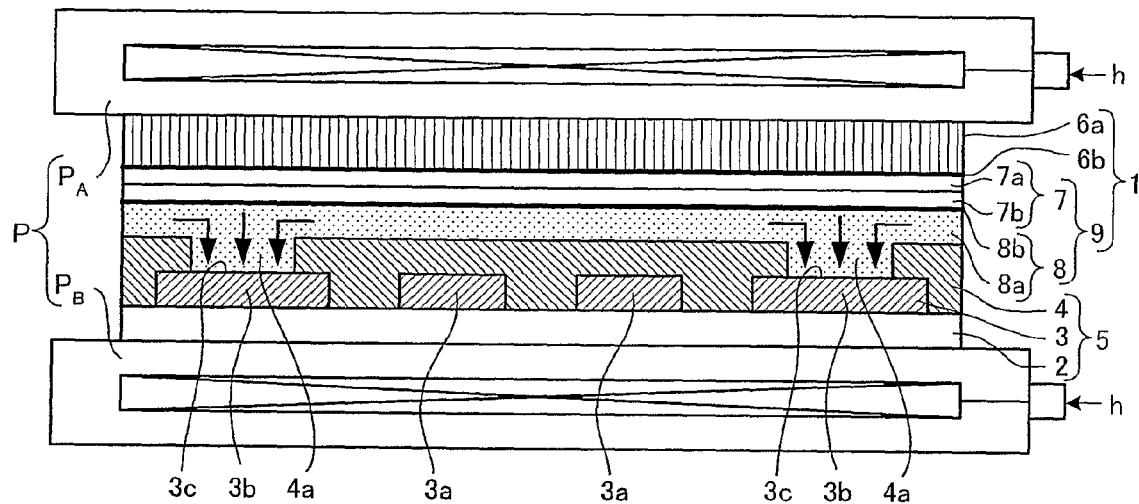
FIG. 1 is a view illustrating a method of manufacturing a shielded FPC according to an embodiment of the invention.
Figure 1:
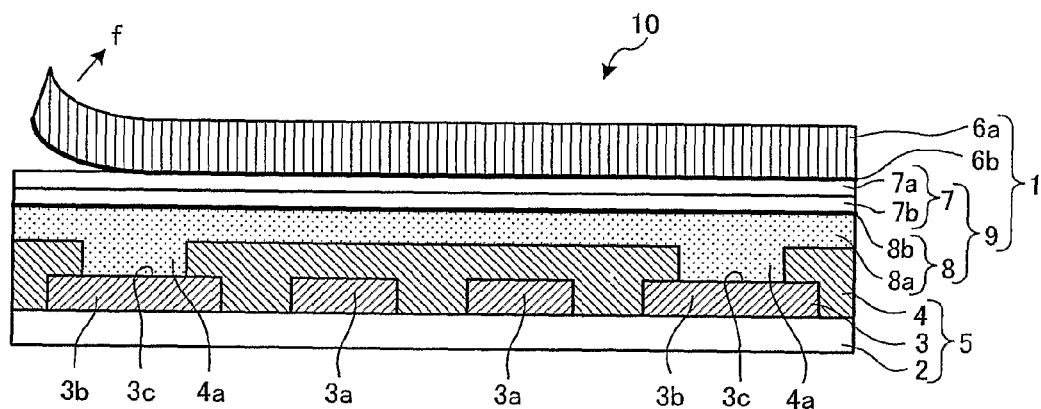
Figure 1:
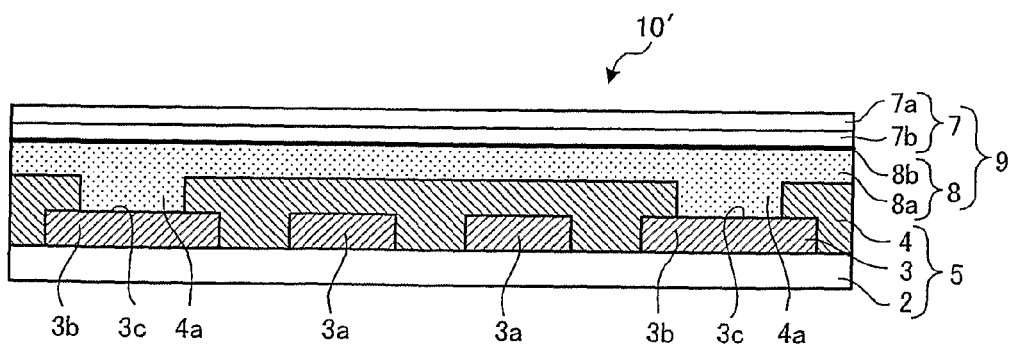
Figure 2:
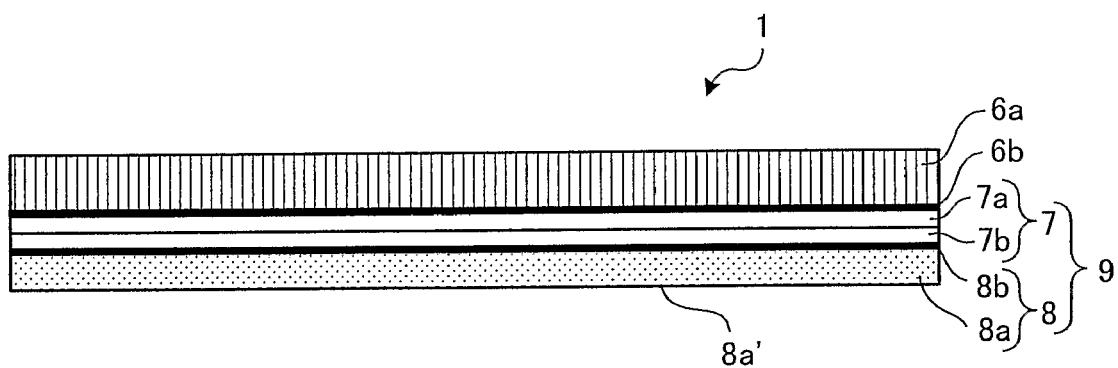
FIG. 2 is a cross-sectional view showing the shielding film used to manufacture the shielded FPC.
Figure 2:
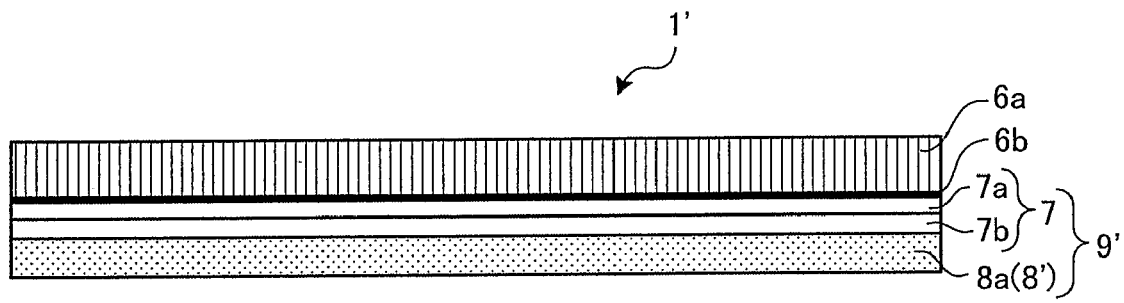

Hereinafter, a shielded FPC according to an embodiment of the invention will be described with reference to the drawings. FIG. 1 is a view illustrating a method of manufacturing a shielded FPC according to the present embodiment, and FIG. 2 is a cross-sectional view showing a shielding film used to manufacture the shielded FPC. FIG. 1(a) shows a state in which a shielding film 1 is placed on a foundation film 5 and is then pressed P by a press P (PA and PB) while being heated h. The foundation film 5 is formed by covering a printed circuit 3, which is formed on a base film 2 and includes a signal circuit 3a and a grounding circuit 3b, with an insulating film 4 except for at least a portion (non-insulated portions) 3c of the grounding circuit 3b.

Here, the base film 2 and the printed circuit 3 may be adhered to each other by an adhesive, and may be adhered to each other without using an adhesive similarly to a so-called non-adhesive type copper-clad laminated plate. In addition, the insulating film 4 may be formed by adhering flexible insulating films to each other by an adhesive, and may be formed by serial methods of coating, drying, exposing developing, and heat-treating a photosensitive insulating resin.

In addition, single-sided FPC having a printed circuit on only one side of a base film, a double-sided FPC having a printed circuit on both sides of a base film, a multilayered FPC in which several FPCs are laminated, a flexboard (registered trade mark) having a multilayered part mounting portion and a cable portion, a flexible rigid board having a multilayered portion made of a hard material, a TAB tape for a tape carrier package, and the like can be properly used as the foundation film 5.

Here, a film shown in FIG. 2(a) is used as the shielding film 1. As shown in FIG. 2(a), the shielding film 1 includes a separation film 6a, a mold-releasing layer 6b formed on one side of the separation film 6a, and a shielding film body 9. The shielding film body 9 includes a cover film 7 and an adhesive layer 8a. The cover film 7 is formed by sequentially coating a hard layer 7a, which is made of a resin having excellent abrasion resistance and blocking resistance, and a soft layer 7b, which is made of a resin having excellent cushioning characteristics, on the mold-releasing layer 6b. The adhesive layer 8a is formed on the surface of the cover film 7 opposite to a mold-releasing layer 6b via a metal layer 8b. Here, a shielding layer 8 is composed of the adhesive layer 8a made of a conductive adhesive, and the metal layer 8b. In the shielding layer 8, an adhesive 8a' softened due to heating h flows in a direction indicated by arrows to insulation removed portions 4a (see FIG. 1(a)). Furthermore, if the mold-releasing layer 6b formed on the separation film 6a has release characteristic with respect to the cover film 7, the mold-releasing layer 6b is not limited to a specific one. For example, it is possible to use a PET film coated by silicon as the mold-releasing layer. Moreover, coating is preferably used as a method of forming the hard layer 7a and the soft layer 7b on one side of the separation film 6a. However, lamination, extrusion, dipping, or the like in addition to coating may be employed as the method of forming the hard layer and the soft layer.

In this way, the adhesive 8a' is sufficiently applied to the non-insulated portions 3c of the grounding circuit 3b, and the insulating film 4. After that, as shown in FIG. 1(b), a shielded-flexible printed circuit board 10 formed as mentioned above is separated from the press P, and the separation film 6a of the shielding film 1 is released together with the mold-releasing layer 6b, thereby obtaining a shielded FPC 10 shown in FIG. 1(c).

As shown in FIG. 2(a), the shielding film 1 has a larger thickness than that of the shielding film body 9 as much as the thickness of the separation film 6a. Accordingly, the shielding film is easily blanked with a predetermined size, can be cleanly cut, and is easily positioned on the foundation film 5.

In addition, cushioning effect caused by the separation film 6 is increased during the heating and pressing, and thus, pressure is slowly applied. As a result, since the adhesive 8a' easily flows into the insulation removed portions 4a and the adhesive 8a' is sufficiently applied to the non-insulated portions 3c of the grounding circuit 3b, connecting conductivity is improved. Furthermore, when the separation film 6a is released together with the mold-releasing layer 6b, a thin and flexible shielded FPC 10' is easily obtained. Further, the shielding film 1 may be used in a rigid circuit board.

All of the base film 2 and the insulating film 4 are made of engineering plastic. For example, a resin such as polypropylene, cross-linked polyethylene, polyester, polybenzimidazole, polyimide, polyimideamide, polyetherimide, polyphenylenesulfide (PPS), or the like is used as the engineering plastic. When thermal resistance is not particularly required, an inexpensive polyester film is preferably used. When fire retardancy is required, a polyphenylenesulfide film is preferably used. Further, when the thermal resistance is required, a polymide film is preferably used.

The hard layer 7a comprising the cover film 7 is made of a resin having abrasion resistance. Abrasion does not occur on the resin composing the hard layer under the following conditions of a rubbing test, which is performed by a (Japan Society for the Promotion of Science type) rubbing tester defined in JIS L 0849. For the conditions, a rubbing element has a mass of 500 g, and a specimen table is horizontally reciprocated in a distance of 120 mm at a speed of 30 reciprocations per minute and is reciprocated 1000 times. The soft layer 7b is made of a resin having an elastic modulus of 3 Gpa (giga pascal) or less. The elastic modulus is measured under the following conditions by a method of testing dynamic mechanical properties, which is defined in JIS K 7244-4. For the conditions, a frequency is 1 Hz, a measurement temperature is in the range of −50 to 150° C., and a temperature rise rate is 5° C./min. Since the separation film 6a needs to be released from the cover film 7 during the post processes, the hard layer 7a is coated on the mold-releasing layer 6b formed on one side of the separation film 6a. Further, after the separation film 6a is released, the hard layer 7a having excellent abrasion resistance serves as a protective layer and prevents the abrasion of the cover film 7. Furthermore, since the hard layer 7a has excellent blocking resistance, the hard layer is not attached to a conveyor jig, conveyor belt, or the like on which the circuit board is loaded to be conveyed, in a process requiring heat, such as a reflow process in the process of mounting circuit components. Since the cover film 7 serving as a base has excellent hardness of the hard layer 7a and cushioning characteristics of the soft layer 7b, breaking such as a crack, fracture, or the like does not occur even when the shielding film is heated and pressed. Moreover, when the shielding film 1 is placed on the foundation film 5 including the printed circuit 3 and is then pressed P by the press P (PA and PB) while heated h, the pressure is slowly applied to the hard layer 7a because of the cushioning effect of the soft layer 7b. Accordingly, it is possible to prevent the hard layer 7a having high hardness from cracking. A thermosetting resin, a thermoplastic resin, an electron beam curable resin, or the like can be used as a resin for the hard layer or the soft layer.

The separation film 6a is also made of engineering plastic similar to the base film 2, the insulating film 4, and the cover film 7. However, since the separation film 6a is removed in the processes of manufacturing the printed circuit board, it is preferable that the inexpensive polyester film be used as the separation film. As described above, since the mold-releasing layer 6b is formed on the surface of the separate film 6a so as to have release characteristic with respect to the hard layer 7a.

The mold-releasing layer 6b may be formed to cover the overall surface of the separate film 6a, or may be formed only on the surface, on which the hard layer 7a is coated, of the separate film. In addition, a silicon film formed by known method can be used as the mold-releasing layer 6b.

The adhesive layer 8a is made of an adhesive resin, that is, a thermoplastic resin or a thermosetting resin. The thermoplastic resin includes polystyrenes, vinyl acetates, polyesters, polyethylenes, polypropylenes, polyamides, rubbers, acryls, and the like. The thermosetting resin includes phenols, epoxys, urethanes, melamines, alkyds, and the like. In addition, the adhesive layer can be also made of a conductive adhesive, which has conductivity by mixing a conductive filler such as a metal, carbon, or the like into the adhesive resin. Furthermore, it is possible to form an anisotropic conductive layer by reducing the amount of the conductive filler. When thermal resistance is not particularly required, a polyester-based thermoplastic resin not having limitation in storage conditions is preferably used. When thermal resistance or better flexibility is required, an epoxy-based thermosetting resin having high reliability after the shielding layer 8 is formed is preferably used. Further, for all of them, it is preferable that the resin hardly flow out of the shielding film during the heating and pressing.

Carbon, silver, copper, nickel, solder, a copper filler coated with silver that is formed by coating aluminum and copper powder with silver, a filler that is formed coating resinous balls or glass pieces with a metal, and the mixture thereof are used as the conductive filler. Silver is expensive, copper lacks reliability in thermal resistance, aluminum lacks reliability in humidity resistance, and solder does not have sufficient conductivity. Therefore, the relatively inexpensive copper filler coated with silver or nickel filler, which has conductivity and high reliability, may be preferably used as the conductive filler.

The mixing ratio of the conductive filler such as the metal filler into the adhesive resin depends on the shape of the filler. However, it is preferable that 10 to 400 parts by weight of the copper filler coated with silver be contained relative to 100 parts by weight of the adhesive resin, and is more preferable that 20 to 150 parts by weight of the copper filler coated with silver be contained relative thereto. When the copper filler coated with silver is more than 400 parts by weight, the adhesion of the copper filler coated with silver to the grounding circuit (copper foil) 3b deteriorates and thus the flexibility of the shielded FPC 10' deteriorates. In addition, when the copper filler coated with silver is less than 10 parts by weight, the conductivity thereof deteriorates. It is preferable that 40 to 400 parts by weight of the nickel filler be contained relative to 100 parts by weight of the adhesive resin, and is more preferable that 100 to 350 parts by weight of the nickel filler be contained relative thereto. When the nickel filler is more than 400 parts by weight, the adhesion to the grounding circuit (copper foil) 3b of the nickel filler deteriorates and thus the flexibility of the shielded FPC 10' deteriorates. In addition, when the nickel filler is less than 40 parts by weight, the conductivity thereof deteriorates. The conductive filler such as a metal filler may be formed in the shape of a sphere, needle, fiber, flake, or resin.

If the conductive filler such as a metal filler is mixed into the adhesive resin as described above, the thickness of the adhesive layer 8a becomes as large as much as that of the filler and thus is about 20±5 am. In addition, if the conductive filler is not mixed into the adhesive resin, the thickness of the adhesive layer is about 1±10 μm. For this reason, since the shielding layer 8 can be made thin, it is possible to obtain a thin shielded FPC 10'.

Aluminum, copper, silver, gold, or the like can be used as a metal material of the metal layer 8b. The metal material may be selected in consideration of the shielding characteristic thereof. However, taking into consideration, copper is likely to be oxidized when coming in contact with the atmosphere, and gold is expensive. Accordingly, inexpensive aluminum or silver having high reliability may be preferably used as the metal material. The thickness of the metal layer is properly set in consideration of the shielding characteristic and flexibility thereof. However, in general, the thickness of the metal layer is preferably set in the range of 0.01 to 1.0 μm. When the thickness of the metal layer is less than 0.01 μm, the shielding effect thereof is not sufficient. In contrast, when the thickness of the metal layer is more than 1.0 μm, the flexibility thereof deteriorates. Vacuum deposition, sputtering, a CVD method, MO (metal organic), plating, and the like can be used as a method of forming the metal layer 8b. However, vacuum deposition is preferable considering mass productivity, and can allow a stable and thin metal film to be obtained at low cost. Moreover, the metal layer is not limited to the thin metal film, and a metal foil may be used as the metal layer.

A shielding film 11 shown in FIG. 2(b) is different from the shielding film 1 shown in FIG. 2(a) in that a shielding layer 8' is formed on one side of the cover film 7. The shielding layer 8' is composed of only an adhesive layer 8a, and the adhesive layer 8a is made of a conductive adhesive into which the conductive filler is mixed. The metal layer 8b has higher conductivity than the adhesive layer 8a. Accordingly, when the metal layer 8b is provided as shown in FIG. 2(a), the conductive adhesive does not need to be used. As a result, it is possible to make the shielding layer 8 thin. In addition, the structure of the shielding layer 8 is not limited thereto, and it is preferable that shielding layer have high conductivity and flexibility.

Figure 3:
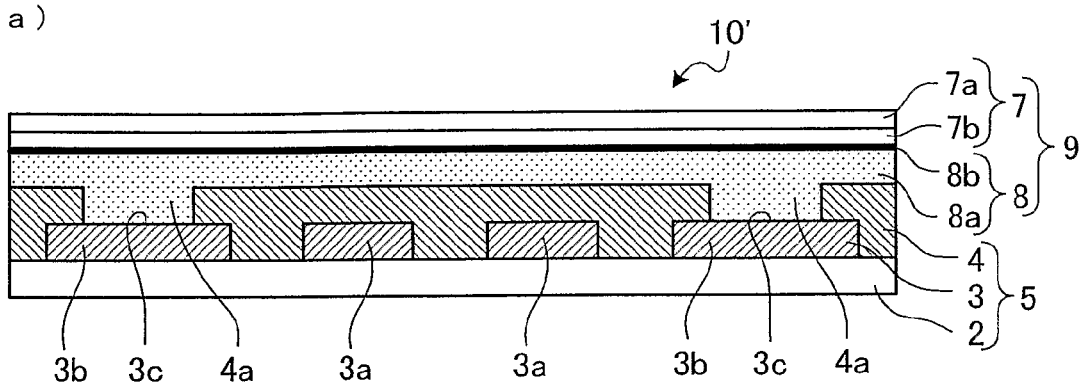
FIG. 3 is a cross-sectional view showing the shielded FPC.
Figure 3:
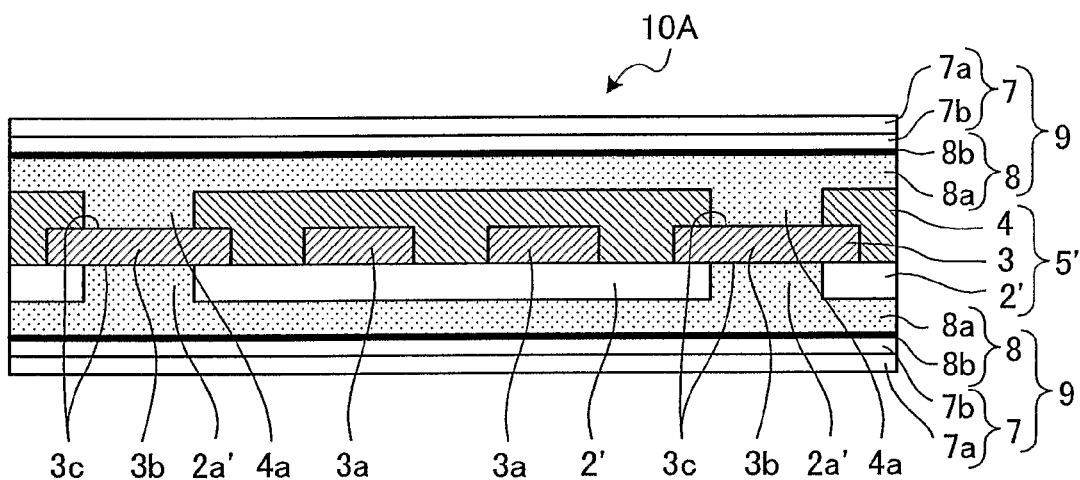
Figure 3:
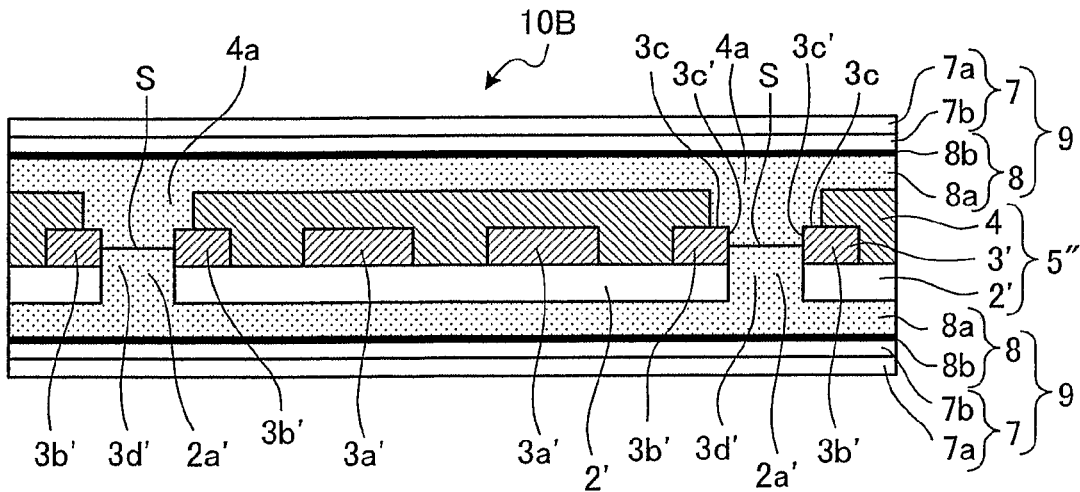

FIG. 3 is a cross-sectional view showing the shielded FPC obtained as described above, and FIG. 3(a) is similar to FIG. 1(c). It is natural that the shielded FPC of the invention includes a shielding film body 9' instead of the shielding film body 9 shown in FIG. 3(a). In the shielding film body 9', the shielding layer 8' is composed of only an adhesive layer 8a made of a conductive adhesive as shown in FIG. 2(b). In addition, various members constituting the shielding film body 9 and a method of forming the shielding film body also include various ones as described above.

Furthermore, the FPC is not limited to the one-sided shielded FPC, and includes both-sided shielded FPC as shown in FIGS. 3(b) and 3(a). In the both-sided shielded FPC 10A of FIG. 3(b), insulation removed portions 4a and 2a' are formed in an insulating film 4 and a base film 2', respectively, in order to connect an adhesive layer 8a with a grounding circuit 3b. The insulating film 4 is disposed on the grounding circuit 3b, and the base film 2' is disposed beneath the grounding circuit. Non-insulated portions 3c, which are upper and lower surfaces of the grounding circuit 3b, are connected to adhesive layers 8a. Here, the base film 2', the printed circuit 3 (a signal circuit 3a and a grounding circuit 3b), and the insulating film 4 constitute a foundation film 5'.

In the both-sided shielded FPC 10B of FIG. 3(c), insulation removed portions 4a and 2a' are formed in an insulating film 4 and a base film 2', respectively. Similar to the both-sided shielded FPC of FIG. 3(b), the insulating film 4 is disposed on the grounding circuit 3b, and the base film 2' is disposed beneath the grounding circuit. However, through holes 3d' are further provided in the grounding circuit 3b to form a grounding circuit 3b'. Accordingly, the adhesive layers 8a permeate into the through holes 3d' from the both sides, and are joined to each other at interfaces S. The upper surface of the non-insulated portion 3c and the inner surface 3c' of the through holes are connected to the adhesive layer 8a. Here, the base film 2', the printed circuit 3' (a signal circuit 3a' and a grounding circuit 3b'), and the insulating film 4 constitute a foundation film 5''.

Figure 4:
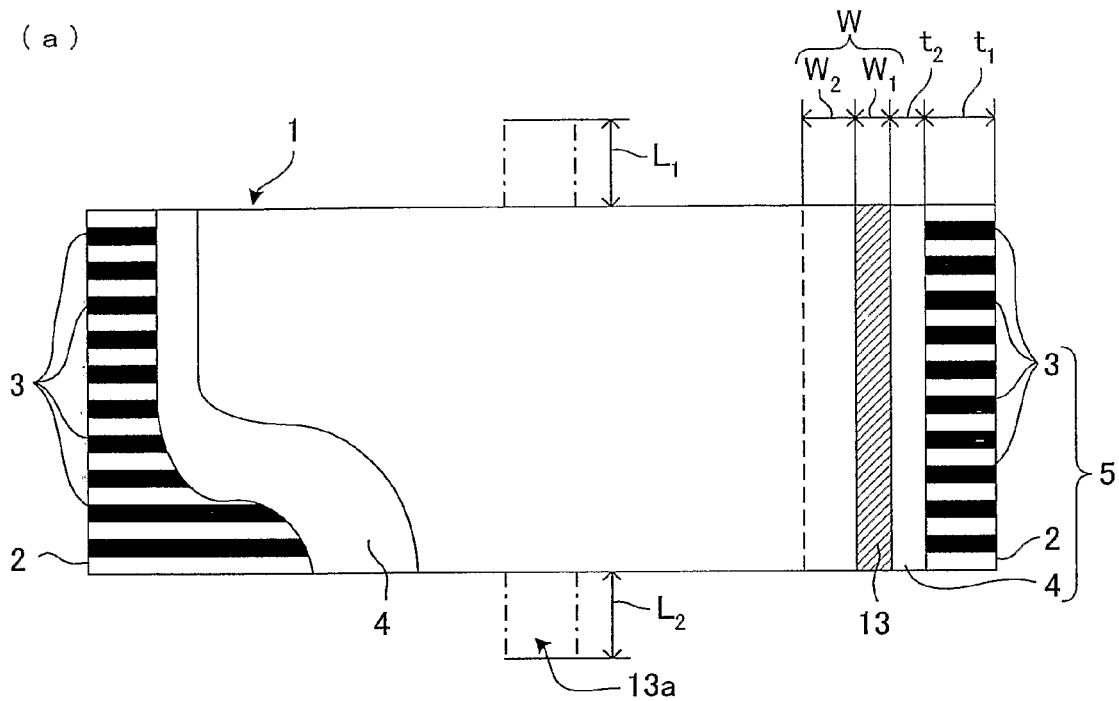
FIG. 4 is a view showing a state in which rectangular ground members are provided to the end of the shielded FPC according to the invention.
Figure 4:
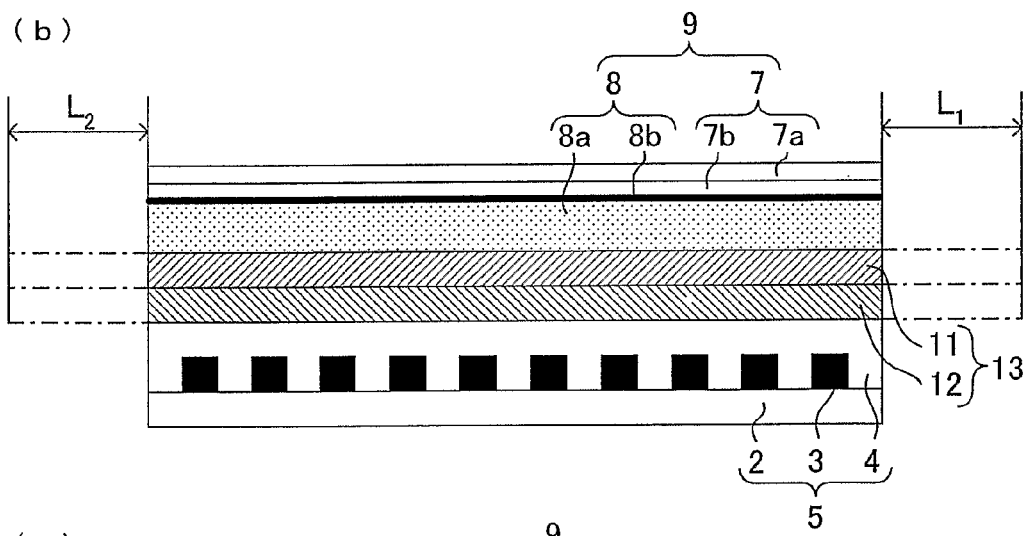
Figure 4:
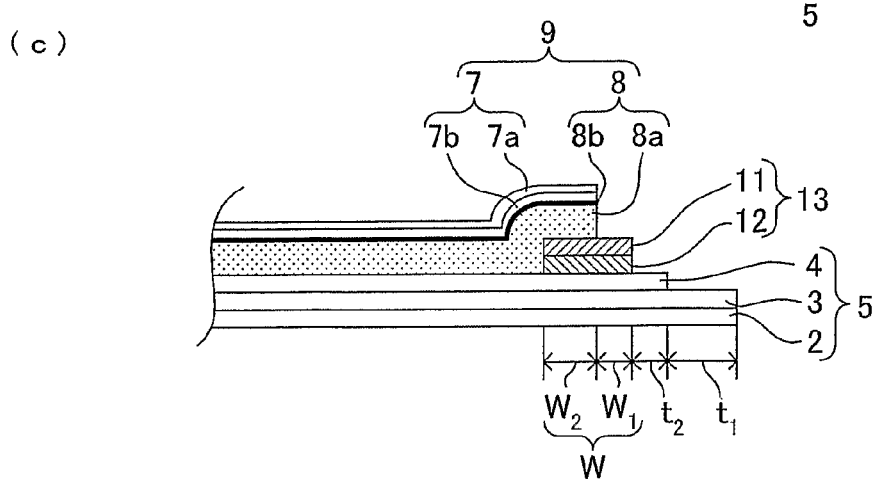

Furthermore, as shown in FIG. 4, in the shielded FPC according to the invention, one surface of the foundation film 5 is covered with the shielding film body 9, and a rectangular ground member 13 can also be provided at the end of the foundation film.

The ground member 13 is a member in which an adhesive resin layer 12 is disposed on one surface of a rectangular metal foil 11 having a width W. As the width W of the ground member 13 is increased, the ground impedance of the ground member 13 is decreased, which is preferable. However, the width W of the ground member is set in consideration of handling and economical efficiency thereof. Furthermore, in the present embodiment, a portion of the ground member corresponding to the width W1 of the width W is exposed, and a portion of the ground member corresponding to the width W2 is adhered to the adhesive layer 8a. If the exposed portion thereof corresponding to the width W1 is connected to the ground portion around it by using a proper conductive member, it is possible to reliably ground the ground member. Moreover, if the ground member is reliably grounded, the width W2 may be further reduced. In the present embodiment, the length of the ground member 13 is set equal to the width of the shielding film body 9 or the foundation film 5 in order to facilitate machining of the ground member. However, the length of the ground member may be set shorter or longer than the width of the shielding film body or the foundation film, and may be set to be connected to the portion of the ground member, which is connected to the conductive-adhesive layer 12, and the portion of the ground member, which is exposed and connected to the ground portion around it.

Similarly, the shape of the ground member 13 is also not limited to the rectangular shape, and may be set so that one portion of the ground member is connected to the adhesive layer 8a and the other portion thereof is connected to the ground portion around it.

In addition, a position of the ground member is not limited to the end portion of the shielded FPC 10', and the ground member may be positioned at the position 13a other than the end portion indicated by an imaginary line in FIG. 4(a). However, in this case, the ground member 13a protrude and is exposed to the side portion from the shielding film body 9 so as to be connected to the ground portion around it. The lengths L1 and L2 of the both portions of the ground member, which protrude from the both sides of the shielding film body, may be set to be grounded to the ground portion around it such as the case of the device, and only one side of the protruding portions may protrude from the shielding film body. The surface of the metal layer 8b comes in contact with the ground portion so as to connected to each other by screws or solder.

Although a copper foil is preferably used as the metal foil 11 of the ground member 13 in consideration of conductivity, flexibility, economical efficiency, and the like, the metal foil is not limited thereto. In addition, although conductive resin can be used instead of the metal foil, it is preferable to use the metal foil in consideration of conductivity.

Furthermore, the adhesive resin layer 12 is made of a thermoplastic resin or a thermosetting resin. The thermoplastic resin includes polystyrenes, vinyl acetates, polyesters, polyethylenes, polypropylenes, polyamides, rubbers, acryls, and the like. The thermosetting resin includes phenols, epoxys, urethanes, melamines, polyimides, alkyds, and the like. It is preferable that the adhesive resin layer is made of a material having excellent adhesion with respect to the metal foil and the adhesive resin layer constituting the ground member 13, or the insulating film 4 of the foundation film 5. Moreover, when being positioned at the position other than the end portion to be covered with the shielding layer 8, the ground member 13 may be made of a metal foil or a metal wire.

As described above, since the shielding layer 8 of the shielding film body 9 is grounded by the ground member 13, it is not necessary to provide a wide ground wire as a part of the printed circuit. For this reason, it is possible to increase wiring density. In addition, the ground impedance of the ground member 13 is easily decreased to be smaller than that of the ground wire of the conventional shielded FPC. Therefore, the electromagnetic wave shielding effect of the shielding layer is also improved.

Further, the invention naturally includes a conventional shielded FPC in which a wide ground wire is provided to ground the shielding layer 8. In this case, since the board ground effect caused by the wide ground wire and the frame ground effect caused by the ground member are added to each other, the electromagnetic wave shielding effect is further improved and stabilized.

The end portion of the foundation film 5 corresponding to the width t1 is exposed, and the printed circuit 3 is exposed. In addition, in the present embodiment, the ground member 13 is adhered to the insulating film 4 such that one end of the ground member in the width direction thereof is kept separate from the end of insulating film by a width t2. Accordingly, insulating resistance between signal lines 4 is ensured by the width t2.

Moreover, the ground member can have various structures other than the structure shown in FIG. 4. For example, the ground member may have the following structure. In the structure, the ground member is a metal foil made of copper, silver, aluminum, or the like. Further, a plurality of conductive bumps protruding from one surface of the metal foil is connected to the shielding layer through the cover film, and the exposed metal foil is connected to the ground portion around it.

In addition, the ground member may have the following structure. In another structure, the ground member is a metal plate, which is made of copper, silver, aluminum, or the like, and has a plurality of protrusions on one surface thereof. The protrusions are connected to the shielding layer through the cover film, and the exposed metal plate is connected to the ground portion around it.

Furthermore, the following ground member may have another structure. In another structure, the ground member is a metal foil made of copper, silver, aluminum, or the like. Further, a plurality of metal fillers protruding from one surface of the metal foil is connected to the adhesive layer and metal layer of the shielding layer through the cover film, and the exposed metal foil is connected to the ground portion around it.

In addition, the following structure may be employed. In the structure, the cover film is removed by excimer laser to form a window at a predetermined position on the shielding film, and one end of the ground member (conductor) is connected to the window through the conductive adhesive into which a conductive filler is mixed. The other end of the ground member is connected to the ground portion around it.

Alternatively, the ground portion around it may be directly connected to the window without using the ground member.

EXAMPLES

Next, the results of the evaluation tests, which are performed with the examples of the invention, and comparative examples will be described.

(1) Rubbing Test

Figure 7:
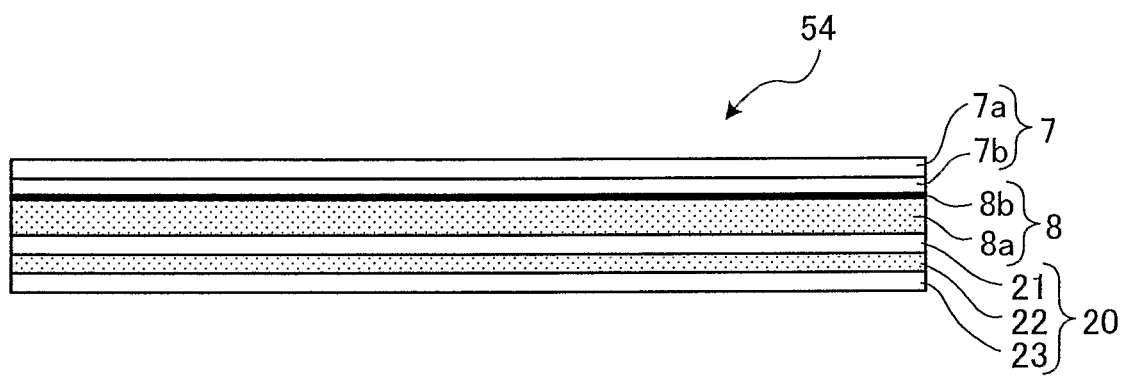
FIG. 7(a) is a cross-sectional view of a specimen used for a rubbing test.
FIG. 7(b) is a cross-sectional view of a specimen used for a blocking resistance test.
Figure 7:
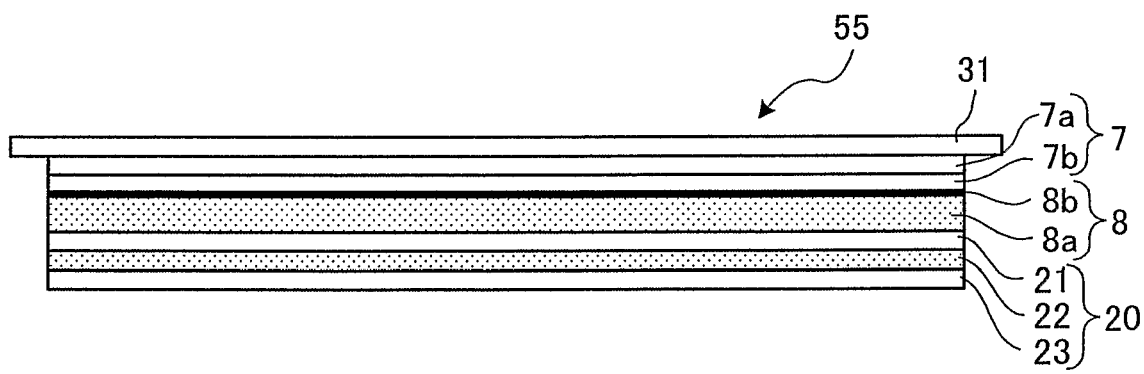

Specimens: Each of the shielding films, which have cover films 7 according to first to third examples and first to third comparative examples shown in Table 1, is adhered to a CCL 20 as shown in FIG. 7(a), and the shielding film and the CCL are then heated and pressed to prepare each sheet having a width of 50 mm and a length of 140 mm. The sheets have been used as the specimens. Here, the CCL 20 is obtained by adhering a polyimide film 23 to a copper foil 21 by an adhesive 22. The thickness of each layer is as follows: the thickness of the hard layer 7a is 2 μm, the thickness of the soft layer 7b is 3 μm, the thickness of the metal layer 8b is 0.15 μm, the thickness of the adhesive layer 8a having conductivity is 20 μm, the thickness of the copper foil 21 is 18 μm, the thickness of the adhesive 22 is 17 μm, and the thickness of the polyimide film 23 is 25 μm.

Figure 5:
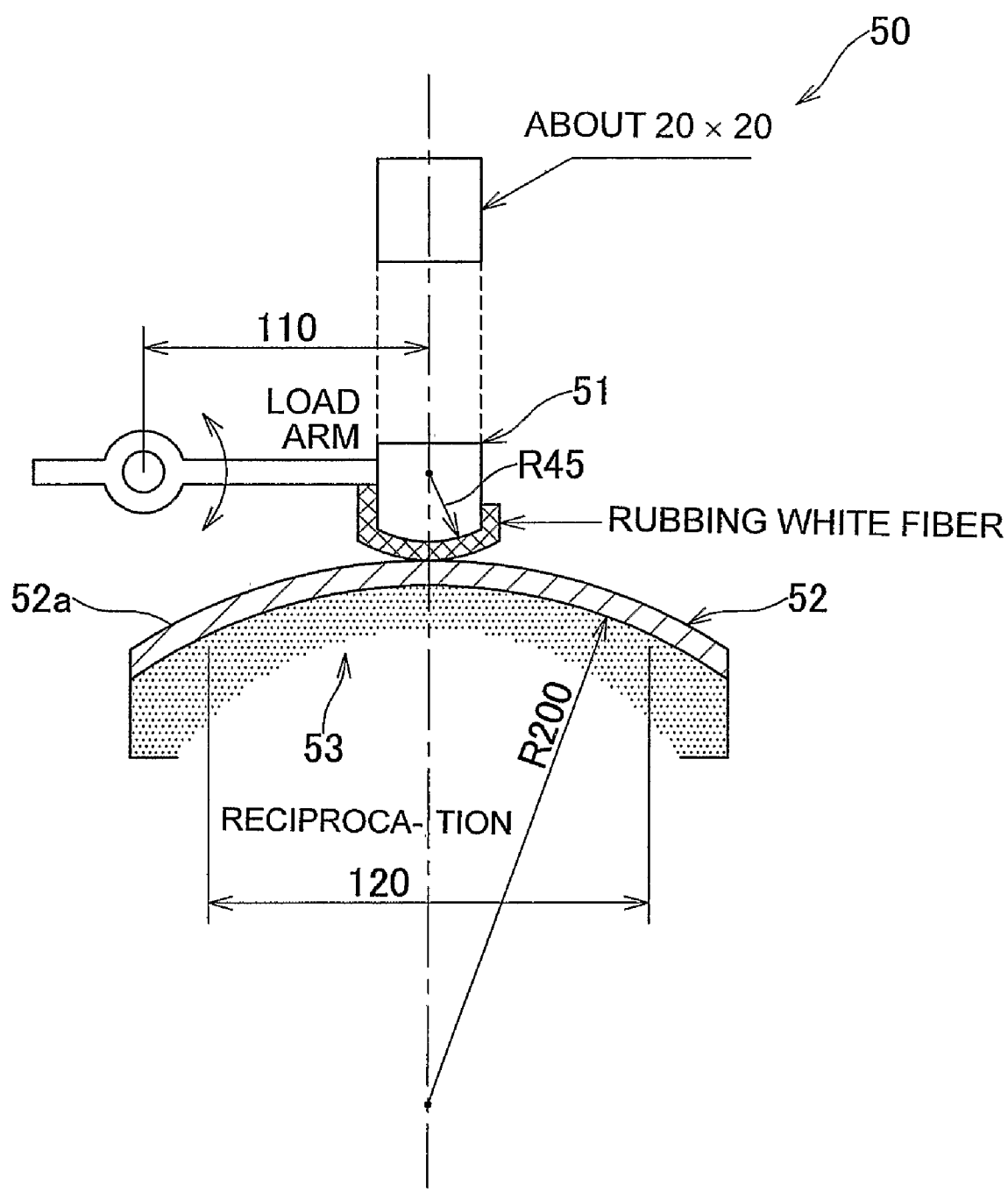
FIG. 5 is a view showing a (Japan Society for the Promotion of Science type) rubbing tester defined in JIS L 0849: 2004.

Test method: As shown in FIG. 5, the rubbing test has been performed by a (Japan Society for the Promotion of Science type) rubbing tester 50 defined in JIS L 0849: 2004. Whether abrasion occurs on the surface 52a of the specimen (abrasion resistance) has been tested under the following conditions. Under the conditions, a rubbing element 51 has a mass of 500 g. Furthermore, a specimen table 53, on which the specimen 52 is placed, is horizontally reciprocated in a distance of 120 mm at a speed of 30 reciprocations per minute. In Table 1, the result is represented as 'O' when abrasion does not occur, and the result is represented as 'x' when abrasion occurs.

(2) Blocking Resistance Test

Specimens: Each of the shielding films, which have cover films 7 according to the first to the third examples and the first to the third comparative examples shown in Table 1, and a polyimide film 31 (Kapton 100H manufactured by Du Pont-Toray Co. Ltd.) (Kapton is a registered trade mark) are adhered to the specimen 54 of the rubbing test disclosed in (1) as shown in FIG. 7(b), and then are heated at 265° C. for 30 seconds to prepare the sheets. The sheets have been used as the specimens.

Test method: The polyimide film 31 is released from the hard layer 7a, and whether transformation occurs on the releasing surface of the hard layer 7a has been tested. In Table 1, the result is represented as 'O' when abrasion does not occur, and the result is represented as 'x' when abrasion occurs.

(3) Elastic Modulus Test

Specimens: Each of sheets, which has a width of 50 mm, a length of 100 mm, and a thickness of 15 μm, and is made of modified epoxy, and a sheet, which has a width of 50 mm, a length of 100 mm, and a thickness of 9 μm, and is made of PPS according to a third comparative example, are prepared to be used as soft layers 7b of the first to the third examples and the second comparative example shown in Table 1. The sheets have been used as specimens.

Figure 6:
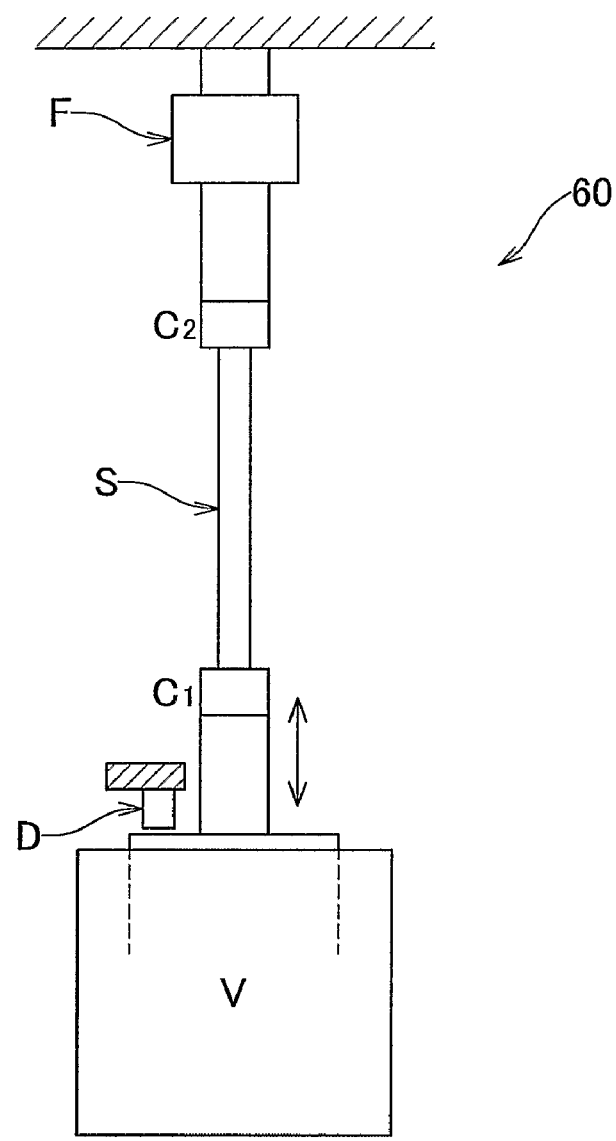
FIG. 6 is view showing a dynamic elastic modulus-measuring device using a tensile non-resonant oscillation method, which is defined in JIS K 7244-4.

Test method: As shown in FIG. 6, a specimen S is clamped by clamps C1 and C2. Then, while the specimen is oscillated by an oscillator V at a frequency of 1 Hz and is heated at a rising temperature rate of 5° C./min, an elastic modulus has been measured by a dynamic elastic modulus measuring device (EXSTAR 6100 DMS by manufactured by SII Nano Technology Inc.: old SEIKO Instruments Inc.) 60 using a tensile non-resonant oscillation method, which is defined in JIS K 7244-4, in the measurement temperature range of −50 to 150° C.

(4) Sliding Resistance Test

Specimens: The respective cover films of the second example and the third comparative example are used to be laminated as shown in FIG. 1(c) in order to form shielded FPCs 10' having a width of 12 mm and a length of 150 mm. The shielded FPCs 10' have been used as the specimens.

Figure 8:
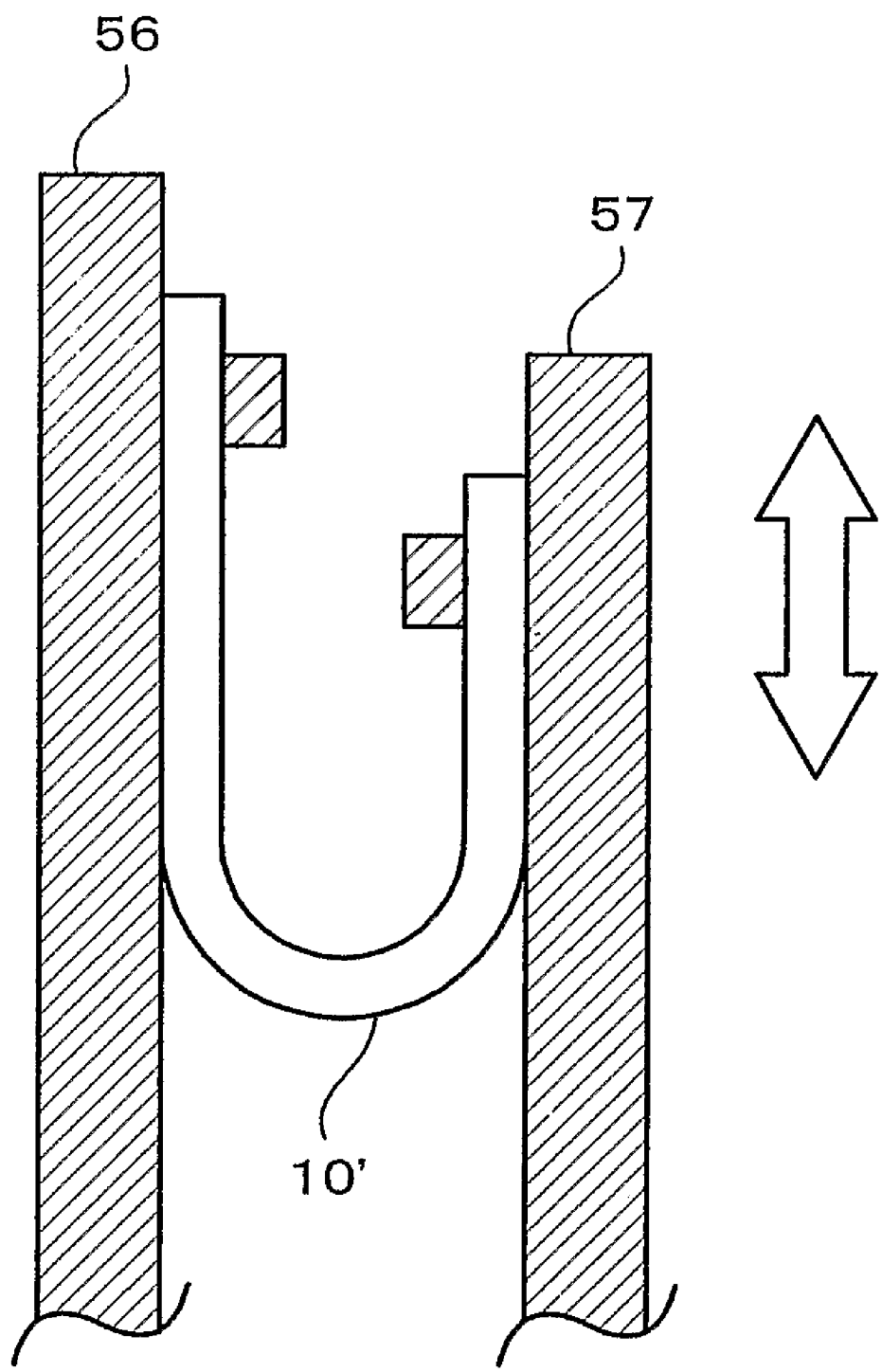
FIG. 8 is a view illustrating a test method of a sliding resistance test.

Test method: As shown in FIG. 8, a shielded FPC 10' is bent in the shape of a letter 'U', and is provided between a stationary plate 56 and a sliding plate 57. Then, the sliding plate 57 slides in a vertical direction on the basis of IPC standards. Under the conditions, a measurement temperature is 23° C., a stroke of the sliding plate 57 is 30 mm, and a sliding speed is 1000 times/min. In this case, a flexible duration when the curvature changes (the number of sliding times until breakage) has been measured. A printed circuit, which has six lines, a line width of 0.12 mm, and a space width of 0.1 mm, has been used as the printed circuit 3 of the shielded FPC 10'. The result is shown by a log-log graph in FIG. 9 in which a reciprocal number of the radius of curvature R at the U-shaped portion is represented on a vertical axis, and the flexible duration is represented on a horizontal axis.

(5) Embedding Resistance Test

Specimens: The respective cover films of the first to the third examples and the first to the fourth comparative examples are used to be laminated, heated, and pressed as shown in FIG. 1(c) in order to form shielded-flexible printed circuit boards 10 having a width of 12 mm and a length of 150 mm. The shielded-flexible printed circuit boards 10 have been used as specimens.

Figure 10:
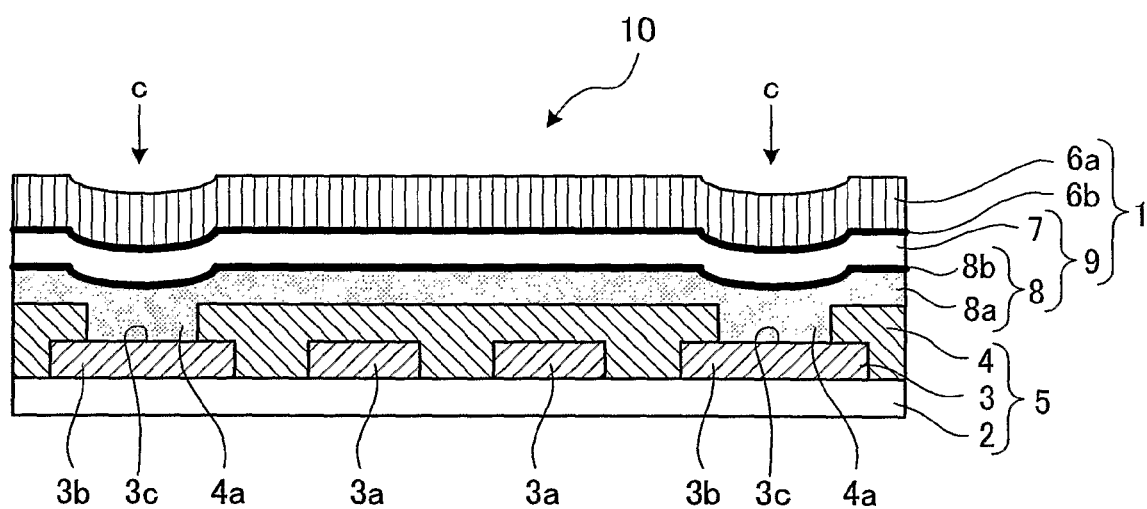
FIG. 10 is a cross-sectional view of a shielded flexible printed circuit board during an embedding resistance test.

Test method: As shown in a cross-sectional view of FIG. 10, whether a crack/fracture of the metal layer or breakage of the cover film occurs due to dents C occurring when the shielded-flexible printed circuit boards 10 are heated and pressed has been observed with the naked eye.

First Example

The following shielding film is used as a first example. The shielding film includes a hard layer, a soft layer, and a shielding layer. The hard layer has a thickness of 2 μm and is formed by mixing 100 parts by weight of ultraviolet curing polyfunctional acrylate and 50 parts by weight of ultraviolet curing bifunctional acrylate to each other. The soft layer has a thickness of 3 μm, and is made of a modified epoxy resin. Furthermore, the shielding layer is formed on the soft layer. Then, abrasion resistance, blocking resistance, and embedding resistance has been evaluated for the first example. In this case, the thickness of an evaporated silver layer, which is the metal layer 8b of the shielding layer 8, has been set to 0.15 μm, the thickness of the adhesive layer 8a having conductivity has been set to 20 μm, the thickness of the insulating layer has been set to 40 μm, and the diameter of the insulation removed portion has been set to 1.4 mmφ (hereinafter, the structures of the shielding layer and the insulating film will be the same as those in the second and third examples, and the first to the fourth comparative examples). The results of the rubbing test, the blocking resistance test, and the embedding resistance test are shown in Table 1.

Second Example

Figure 9:
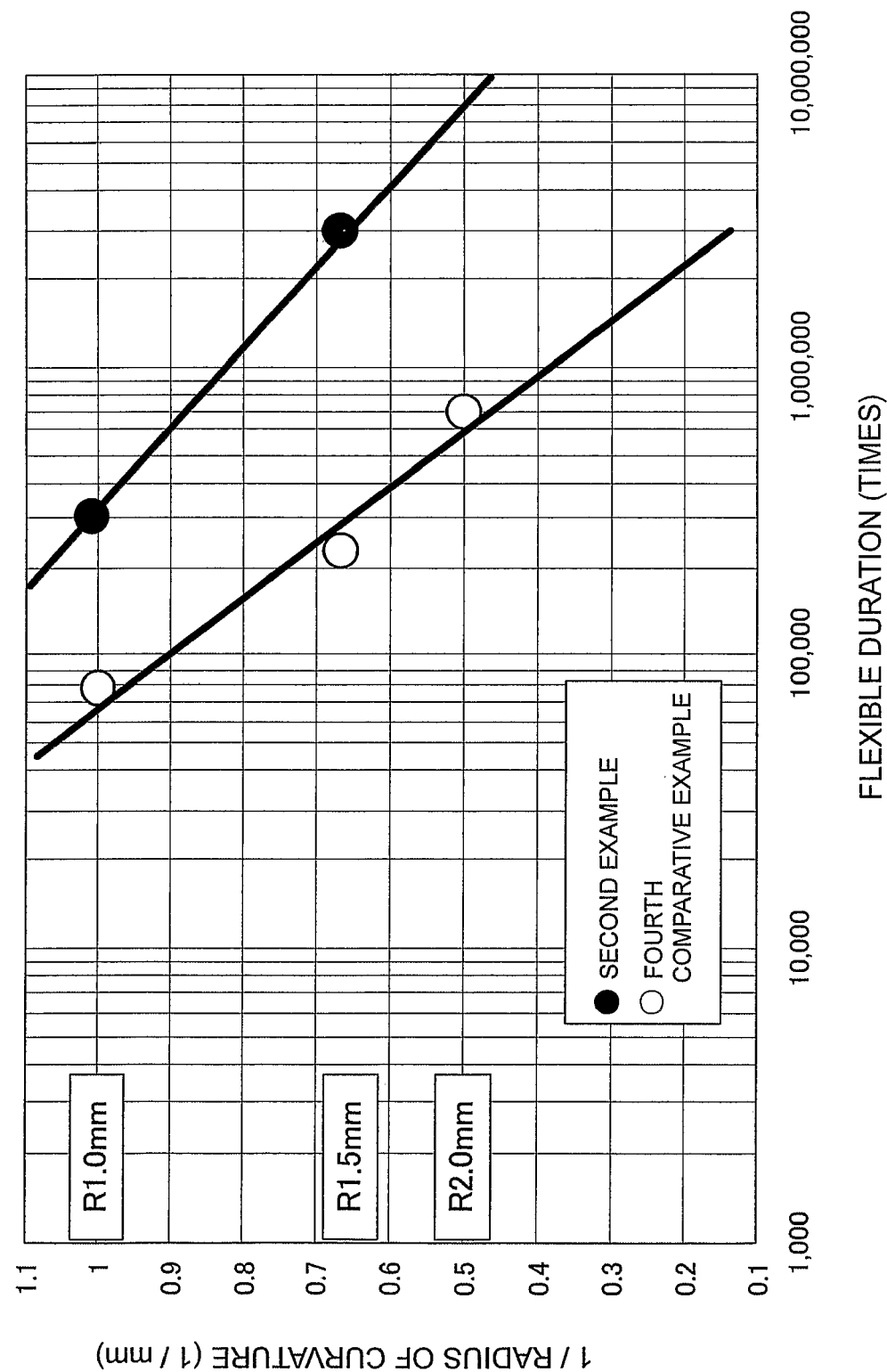
FIG. 9 is a graph representing the result of the sliding resistance test.

The following shielding film is used as a second example. The shielding film includes a hard layer, a soft layer, and a shielding layer. The hard layer has a thickness of 2 μm and is formed by mixing 100 parts by weight of ultraviolet curing polyfunctional acrylate and 150 parts by weight of ultraviolet curing bifunctional acrylate to each other. The soft layer has a thickness of 3 μm, and is made of a modified epoxy resin. Furthermore, the shielding layer is formed on the soft layer. Then, abrasion resistance, blocking resistance, and embedding resistance has been evaluated for the second example. The results thereof are shown in Table 1. In addition, a flexible duration has been evaluated through the sliding resistance test. The result thereof is shown in FIG. 9.

Third Example

The following shielding film is used as a third example. The shielding film includes a hard layer, a soft layer, and a shielding layer. The hard layer has a thickness of 2 μm and is formed by mixing 100 parts by weight of ultraviolet curing polyfunctional acrylate and 250 parts by weight of ultraviolet curing bifunctional acrylate to each other. The soft layer has a thickness of 3 μm, and is made of a modified epoxy resin. Furthermore, the shielding layer is formed on the soft layer. Then, abrasion resistance, blocking resistance, and embedding resistance has been evaluated for the third example. The results thereof are shown in Table 1.

First Comparative Example

The following shielding film is used as a first comparative example. The shielding film includes a hard layer and a shielding layer, and does not include a soft layer. The hard layer has a thickness of 2 μm and is made of ultraviolet curing bifunctional acrylate. Furthermore, the shielding layer is formed on one surface of the hard layer. Then, abrasion resistance, blocking resistance, and embedding resistance has been evaluated for the first comparative example. The results thereof are shown in Table 1.

Second Comparative Example

The following shielding film is used as a second comparative example. The shielding film includes a hard layer and a shielding layer, and does not include a soft layer. The hard layer has a thickness of 2 μm and is made of ultraviolet curing polyfunctional acrylate. Furthermore, the shielding layer is formed on one surface of the hard layer. Then, abrasion resistance, blocking resistance, and embedding resistance has been evaluated for the second comparative example. The results thereof are shown in Table 1.

Third Comparative Example

The following shielding film is used as a third comparative example. The shielding film includes a soft layer and a shielding layer, and does not include a hard layer. The soft layer has a thickness of 3 μm and is made of a modified epoxy resin. Furthermore, the shielding layer is formed on one surface of the soft layer. Then, abrasion resistance, blocking resistance, and an embedding resistance have been evaluated for the third comparative example. The results thereof are shown in Table 1.

Fourth Comparative Example

The following shielding film is used as a fourth comparative example. The shielding film includes a cover film and a shielding layer. The cover film has a thickness of 9 μm and is made of PPS. Furthermore, the shielding layer is formed on one surface of the cover film. Then, abrasion resistance, blocking resistance, and embedding resistance has been evaluated for the fourth comparative example. The results thereof are shown in Table 1. In addition, a flexible duration has been evaluated through the sliding resistance test. The result thereof is shown in FIG. 9.

and the adhesive layer 8a, which is formed on the surface of the cover film 7 opposite to the separation film 6a via the metal layer 8b. In this case, the cover film 7 includes at least one hard layer 7a and at least one soft layer 7b. Further, the surface of the cover film 7 facing the separation film 6a is composed of the hard layer 7a. As a result, the surface facing

TABLE 1

|  |  | EXAMPLES | | | COMPARATIVE EXAMPLES | | | |
|---|---|---|---|---|---|---|---|---|
|  |  | 1 | 2 | 3 | 1 | 2 | 3 | 4 |
| COVER FILM | HARD LAYER | A | B | C | ULTRAVIOLET CURING BIFUNCTIONAL ACRYLATE 2 μm | ULTRAVIOLET CURING POLYFUNCTIONAL ACRYLATE 2 μm | NONE | PPS 9 μm |
|  |  | 2 μm | | | | | | |
|  | SOFT LAYER | MODIFIED EPOXY 3 μm | | | NONE | NONE | MODIFIED EPOXY 3 μm | |
| CHARACTERISTIC EVALUATION | ABRASION RESISTANCE | ○ | ○ | ○ | x | ○ | x | x |
|  | BLOCKING RESISTANCE | ○ | ○ | ○ | x | ○ | x | ○ |
|  | EMBEDDING RESISTANCE | ○ | ○ | ○ | x | x | x | ○ |

A: 100 parts by weight of ultraviolet curing polyfunctional acrylate/50 parts by weight of ultraviolet curing bifunctional acrylate
B: 100 parts by weight of ultraviolet curing polyfunctional acrylate/150 parts by weight of ultraviolet curing bifunctional acrylate
C: 100 parts by weight of ultraviolet curing polyfunctional acrylate/250 parts by weight of ultraviolet curing bifunctional acrylate As clarified from the results of the rubbing test, the blocking resistance test, and the embedding resistance test as shown in Table 1, all of the first to the third examples have excellent abrasion resistance, blocking resistance, and embedding resistance. However, there has been no comparative example that satisfies all of the excellent abrasion resistance, blocking resistance, and embedding resistance. That is, although each of the first and the third comparative examples has a relatively small thickness, the first and the third comparative examples have poor abrasion resistance, blocking resistance, and embedding resistance. The second comparative example has a small thickness, excellent abrasion resistance, and excellent blocking resistance. However, the second comparative example has poor embedding resistance. In addition, although the fourth comparative example has excellent blocking resistance and excellent embedding resistance, there is a problem in that the fourth comparative example has a large thickness and poor abrasion resistance.

Furthermore, the following fact has been understood through the elastic modulus test. The elastic modulus of a sheet, which is composed of each soft layer 7b made of modified epoxy according to the first to the third examples and the third comparative example, is 0.1 Gpa, and the elastic modulus of a sheet, which is composed of the soft layer 7b made of PPS according to the fourth comparative example, is 6 Gpa. As a result, it has been understood that the soft layer 7b made of modified epoxy is very flexible, and has excellent cushioning effect.

In addition, as clarified from the result of the sliding resistance test, it has been understood that the second example has longer flexible duration than the fourth comparative example, and is hardly broken.

As disclosed above, the shielding film 1 according to the present embodiment includes the separation film 6a, the cover film 7 provided on one surface of the separation film 6a, the separation film 6a is composed of the hard layer 7a, and the hard layer 7a having excellent abrasion resistance serves as a protective layer after the release of the separation film 6a. Accordingly, it is possible to prevent the abrasion of the cover film 7. Furthermore, since the hard layer 7a has excellent blocking resistance, the hard layer is not attached to a conveyor jig, conveyor belt, or the like on which the circuit board is loaded to be conveyed, in a process requiring heat, such as a reflow process in the process of mounting circuit components. In addition, the hard layer 7a has excellent hardness. For this reason, even though the metal layer 8b provided on the hard layer 7a via the soft layer 7b is heated and pressed, breakage such as a cracking, fracture, or the like does not occur. Further, when the shielding film 1 is adhered to the foundation 5 including the printed circuit 3, it is possible to prevent the hard layer 7a from cracking because of the cushioning effect of the soft layer 7b.

Moreover, in the shielding film 1 according to the present embodiment, at least one layer of the above-mentioned hard layer 7a and the soft layer 7b is composed of a coating layer. As a result, it is possible to reduce the thickness of the shielding film 1.

Further, the shielded printed circuit board according to the present embodiment includes the metal layer 8b, which is provided on at least one surface of the foundation 5 including at least one printed circuit 3 via the adhesive layer 8a, and the cover film 7, which is provided on the surface of the metal layer 8b opposite to the adhesive layer 8a. In this case, the cover film 7 includes at least one hard layer 7a and at least one soft layer 7b. Further, the outermost surface of the cover film 7 is composed of the hard layer 7a. As a result, the outermost surface layer of the cover film 7 is composed of the hard layer 7a having excellent abrasion resistance and blocking resistance. Accordingly, it is possible to prevent the abrasion of the cover film 7. Furthermore, since the hard layer 7a has excellent blocking resistance, the hard layer is not attached to a conveyor jig, conveyor belt, or the like on which the circuit board is loaded to be conveyed, in a process requiring heat, such as a reflow process in the process of mounting circuit components.

Moreover, in the shielded flexible printed circuit board (shield FPC 101) according to the present embodiment, the foundation 5 including the printed circuit 3 is composed of a flexible printed circuit board. As a result, the shielded flexible printed circuit board can have excellent sliding resistance, which is a characteristic required for the flexible printed circuit board.

Further, in the shielded flexible printed circuit board (shield FPC 10') according to the present embodiment, when the foundation 5 including the printed circuit 3 is composed of a TAB tape for a tape carrier package, the shielding film 1 has excellent flexibility. As a result, since the rebound resilience of the shielding film deteriorates, it is possible to improve the assembly efficiency.

In the shielding film 1 according to the present embodiment, the adhesive layer 8a, which is formed on the surface of the cover film 7 opposite to the separation film 6a via the metal layer 8b, is composed of a conductive adhesive. Accordingly, the metal layer 8b and the grounding circuit 3b of the printed circuit board can be electrically connected to each other.

In the shielding film 1 according to the present embodiment, the above-mentioned conductive adhesive is composed of an anisotropic conductive adhesive. If the anisotropic conductive adhesive is used, it is possible to reduce the thickness of the shielding film and thereof used to form the shielding film as compared to when the conductive adhesive is used. Therefore, since an amount of the conductive fillers is little, it is possible to improve flexibility of the shielding film.

Furthermore, in a method of manufacturing the shielding film according to the present embodiment, the cover film 7 is formed by laminating a hard layer 7a and a soft layer 7b on one surface of the separation film 6a. The shielding film according to the invention includes the separation film 6a, the cover film 7 provided on one surface of the separation film 6a, and the adhesive layer 8a, which is formed on the surface of the cover film 7 opposite to the separation film 6a via the metal layer 8b. As a result, it is possible to manufacture the shielding film 1, which has excellent abrasion resistance and blocking resistance. Furthermore, even though the shielding film is heated and pressed, breakage such as cracking, fracture, or the like does not occur in the shielding film 1.

Moreover, in the method of manufacturing the shielding film according to the present embodiment, at least one layer of the above-mentioned hard layer 7a and the soft layer 7b is composed of a coating layer. According to this structure, since it is possible to reduce the thickness of the cover film 7, it is possible to manufacture the shielding film 1 having excellent flexibility.

In the method of manufacturing the shielding film according to the present embodiment, the above-mentioned hard layer 7a and the soft layer 7b are sequentially coated on one surface of the separation film 6a. According to this structure, since the separation film 6a can be used as a carrier film, it is possible to also reduce the thickness of the hard layer 7a and the soft layer 7b. In addition, it is possible to provide the shielding film 1, which has a thinner cover film 7, having excellent flexibility, and to reliably provide the shielding film at low cost.

Further, as for a method of manufacturing the shielded printed circuit board according to the present embodiment, in the above-mentioned shielded printed circuit board, the above-mentioned shielding film 1 is placed on at least one surface of the foundation 5 including at least one printed circuit 3, and is heated and pressed. After that, the separation film 6a is released. According to this method, it is possible to very easily manufacture the following shielded printed circuit board in which breakage does not occur in the metal layer 8b and a cover film 7. The cover film 7 has excellent abrasion resistance and blocking resistance, and does not crack.

Furthermore, in a method of manufacturing the shielded printed circuit board according to the present embodiment, a portion of an insulating material covering the grounding circuit 3b is removed from the printed circuit 3, which includes the signal circuit 3a and the grounding circuit 3b formed on the base film 2, in order to prepare the foundation 5 having the exposed grounding circuit 3b. Then, the shielding film 1 having the above-mentioned adhesive layer, which is composed of the conductive adhesive or the anisotropic conductive adhesive, is placed on the foundation 5, and the shielding film and the foundation are heated and pressed so that the shielding film and the foundation are adhered to each other and the grounding circuit 3b is electrically connected with the metal layer 8b. According to this method, since the conductive adhesive or the anisotropic conductive adhesive softened due to heating is easily embedded into the insulation removed portions 4a, it is possible to ground the metal layer 8a or the shielding layer 8, which is composed of the metal layer 8b and the adhesive layer 8a through the ground circuit 3b. In addition, when the adhesive layer 8a is non-conductive, the metal layer 8b may be connected to a case or the like by another method.

Moreover, in the method of manufacturing the shielded printed circuit board according to the present embodiment, the foundation 5 including at least one printed circuit 3 is composed of a flexible printed circuit board. According to this method, it is possible to obtain the flexible printed circuit board having excellent flexibility and sliding resistance.

In addition, in the method of manufacturing the shielded printed circuit board according to the present embodiment, the foundation 5 including at least one printed circuit 3 is composed of a TAB tape for a tape carrier package. According to this method, it is possible to obtain a TAB tape for a tape carrier package, which is soft and has excellent assembly efficiency.

Although the invention has been described with reference to a preferred embodiment, the invention can be modified within the scope thereof. That is, the cover film may have a three-layer structure in which another hard layer is coated on a soft layer coated on a hard layer. Even in this case, the metal layer provided on the cover film is hardly broken because of the hardness of the hard layer, and it is possible to prevent the hard layer from cracking because of the cushioning characteristics of the soft layer.

INDUSTRIAL APPLICABILITY

The invention can be applied to shield a printed circuit board, which is used in a device such as a computer, communication device, printer, mobile phone, video camera, or the like, from electromagnetic wave.

The invention claimed is:

1. A shielding film comprising:
 a separation film;
 a cover film provided on one surface of the separation film; and
 an adhesive layer, which is formed on the surface of the cover film opposite to the separation film via a metal layer, wherein the cover film includes at least one hard layer and at least one soft layer, and the surface of the cover film facing the separation film is composed of the hard layer.

2. The shielding film according to claim 1, wherein at least one of the hard layer and the soft layer is composed of a coating layer.

3. The shielding film according to claim 1 or 2, wherein the adhesive layer, which is formed on the surface of the cover film opposite to the separation film via the metal layer, is composed of a conductive adhesive.

4. The shielding film according to claim 3, wherein the conductive adhesive is an anisotropic conductive adhesive.

5. A shielded printed circuit board comprising:

a metal layer, which is provided on at least one surface of a foundation including at least one printed circuit via an adhesive layer; and a cover film, which is provided on the surface of the metal layer opposite to the adhesive layer, wherein the cover film includes at least one hard layer and at least one soft layer, and the outermost surface layer of the cover film is composed of a hard layer.

6. The shielded flexible printed circuit board according to claim 5, wherein the foundation including the printed circuit is composed of a flexible printed circuit board.

7. The shielded flexible printed circuit board according to claim 6, wherein the foundation including the printed circuit is composed of a TAB tape for a tape carrier package.

8. A method of manufacturing a shielding film, which comprises a separation film, a cover film provided on one surface of the separation film, and an adhesive layer that is formed on the surface of the cover film opposite to the separation film via the metal layer, wherein the cover film is formed by laminating a hard layer and a soft layer on one surface of the separation film.

9. The method of manufacturing a shielding film according to claim 8, wherein at least one layer of the hard layer and the soft layer is composed of a coating layer.

10. The method of manufacturing a shielding film according to claim 8, wherein the hard layer and the soft layer are sequentially coated on one surface of the separation film.

11. A method of manufacturing a shielded printed circuit board, comprising:

placing a shielding film on at least one surface of a foundation including at least one printed circuit, the shield film including a separation film;

a cover film provided on one surface of the separation film; and an adhesive layer, which is formed on the surface of the cover film opposite to the separation film via a metal layer, wherein the cover film includes at least one hard layer and at least one soft layer, and the surface of the cover film facing the separation film is composed of the hard layer;

heating and pressing the shielding film; and releasing the separation film.

12. The method of manufacturing a shielded printed circuit board according to claim 11, wherein the foundation including at least one printed circuit is composed of a flexible printed circuit board.

13. The method of manufacturing a shielded printed circuit board according to claim 11, wherein the foundation including at least one printed circuit is composed of a TAB tape for a tape carrier package.

14. A method of manufacturing a shielded printed circuit board, comprising:

removing a portion of an insulating material covering a grounding circuit from a printed circuit, which includes a signal circuit and a grounding circuit formed on a base film, in order to prepare a foundation having the exposed grounding circuit;

placing a shielding film on the foundation, the shielding film including a separation film;

a cover film provided on one surface of the separation film; and an adhesive layer, which is formed on the surface of the cover film opposite to the separation film via a metal layer, wherein the cover film includes at least one hard layer and at least one soft layer, and the surface of the cover film facing the separation film is composed of the hard layer, wherein the adhesive layer, which is formed on the surface of the cover film opposite to the separation film via the metal layer, is composed of a conductive adhesive; and heating and pressing the shielding film and the foundation so that the shielding film and the foundation are adhered to each other and the grounding circuit is electrically connected with the metal layer.

15. The method of manufacturing a shielded printed circuit board according to claim 14, wherein the foundation including at least one printed circuit is composed of a flexible printed circuit board.

16. The method of manufacturing a shielded printed circuit board according to claim 14, wherein the foundation including at least one printed circuit is composed of a TAB tape for a tape carrier package.

* * * * *